US009997588B2

United States Patent
Jung et al.

(10) Patent No.: US 9,997,588 B2
(45) Date of Patent: Jun. 12, 2018

(54) DISPLAY DEVICE HAVING SIGNAL LINE EXTENDING TO NON-DISPLAY AREA

(71) Applicant: LG DISPLAY CO., LTD., Seoul (KR)

(72) Inventors: Seung-Won Jung, Paju-si (KR);
Dong-Sun Kim, Goyang-si (KR);
Won-Joon Ho, Jeonju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days. days.

(21) Appl. No.: 15/479,645

(22) Filed: Apr. 5, 2017

(65) Prior Publication Data

US 2018/0006104 A1   Jan. 4, 2018

(30) Foreign Application Priority Data

Jun. 30, 2016   (KR) ........................ 10-2016-0082915

(51) Int. Cl.
*H01L 23/48* (2006.01)
*H01L 27/32* (2006.01)
*H01L 51/00* (2006.01)
*H01L 51/52* (2006.01)

(52) U.S. Cl.
CPC ...... *H01L 27/3276* (2013.01); *H01L 27/3272* (2013.01); *H01L 51/0096* (2013.01); *H01L 51/5253* (2013.01)

(58) Field of Classification Search
CPC ............. H01L 27/3276; H01L 27/3272; H01L 51/0096; H01L 51/5253
USPC ........................................................ 257/773
See application file for complete search history.

(56) References Cited

U.S. PATENT DOCUMENTS

| 6,465,892 | B1* | 10/2002 | Suga ..................... H01L 21/768 228/122.1 |
| 2003/0201447 | A1* | 10/2003 | Yamazaki ........... H01L 27/3246 257/79 |
| 2011/0095299 | A1* | 4/2011 | Tsuji ................... H01L 27/3258 257/72 |
| 2013/0316475 | A1* | 11/2013 | Yu .......................... H01L 51/56 438/26 |
| 2015/0049279 | A1* | 2/2015 | Yamazaki ......... G02F 1/133305 349/48 |
| 2015/0294987 | A1* | 10/2015 | Xia ....................... H01L 27/124 257/72 |
| 2016/0043153 | A1* | 2/2016 | Min .................... H01L 51/0097 257/40 |
| 2016/0103359 | A1* | 4/2016 | Kimura .................. G02B 5/201 349/33 |
| 2016/0141549 | A1* | 5/2016 | Odaka ................ H01L 51/5246 257/40 |
| 2016/0210905 | A1* | 7/2016 | Lee ..................... H01L 27/1222 |
| 2016/0219695 | A1* | 7/2016 | Choi ................... H01L 51/0096 |

* cited by examiner

*Primary Examiner* — Nitin Parekh
(74) *Attorney, Agent, or Firm* — Birch, Stewart, Kolasch & Birch, LLP

(57) ABSTRACT

A display device according to an embodiment includes a display panel and a circuit board connected to the display panel. The circuit board is connected to a bonding area of the display panel by an anisotropic conductive film. The display panel includes a cover insulating layer exposing the bonding area. The cover insulating layer includes at least one trench crossing an edge area, which is located outside the bonding area.

10 Claims, 3 Drawing Sheets

DISPLAY DEVICE HAVING SIGNAL LINE EXTENDING TO NON-DISPLAY AREA

This application claims the priority benefit of Korean Patent Application No. 10-2016-0082915, filed on Jun. 30, 2016, which is hereby incorporated by reference as if fully set forth herein.

BACKGROUND OF THE INVENTION

Field of the Invention

The present invention relates to a display device in which signal lines, which transmit signals to realize an image, extend from a display area to a non-display area, which is located outside the display area.

Discussion of the Related Art

Generally electronic appliances, such as a monitor, a TV, a laptop computer, and a digital camera, include a display device to realize an image. An example of the display device may include a liquid crystal display device or an organic light-emitting display device.

Such a display device includes a display panel. The display panel may include a display area and a non-display area, which is located outside the display area. In the non-display area of the display panel, pads may be located in order to receive signals related to an image from an external unit. For example, the non-display area of the display panel may include a bonding area configured to be connected to a circuit board on which a driving IC is mounted. The circuit board may be connected to the bonding area of the display panel using an anisotropic conductive film (ACF).

The pads, which are located in the non-display area of the display panel, may be formed using signal lines, which extend from the display area. In order to prevent the signal lines from being ripped due to, for example, scribing, an outer cover insulating layer may be located in the edge area of the display panel, which is located outside the bonding area, so as to cover the signal lines. For example, the outer cover insulating layer may extend along the edge of the display panel.

However, the outer cover insulating layer may prevent air bubbles, which are generated by the anisotropic conductive film in a connecting process of the circuit board, from being discharged to the outside of the display panel. As a result, the connecting process of the circuit board may be unstable.

SUMMARY OF THE INVENTION

Accordingly, the present invention is directed to a display device having signal lines extending to a non-display area that substantially obviates one or more problems due to limitations and disadvantages of the related art.

An object of the present invention is to provide a display device, which may prevent signal lines located in a non-display area from being ripped, and may ensure the stable implementation of a process of connecting a circuit board.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a display device including a lower substrate including a display area, an edge area located outside the display area, and a bonding area located between the display area and the edge area, signal lines located in the display area of the lower substrate and extending onto the bonding area and the edge area, and an outer cover insulating layer located in the edge area of the lower substrate and covering the signal lines, wherein the outer cover insulating layer includes at least one trench configured to extend in a longitudinal direction of the signal lines.

The trench may completely cross the edge area of the lower substrate.

The trench may vertically penetrate the outer cover insulating layer.

The display device may further include an outer protective layer located between the signal lines and the outer cover insulating layer in the edge area of the lower substrate, and the trench may vertically penetrate the outer protective layer.

The display device may further include an anisotropic conductive film located in the bonding area of the lower substrate, and a circuit board located on the anisotropic conductive film and extending to the edge area of the lower substrate, and the trench may have a bottom surface that is lower than a lower surface of the anisotropic conductive film.

The display device may further include pad electrodes located between the signal lines and the anisotropic conductive film in the bonding area of the lower substrate.

The trench may have a bottom surface, a lowermost level of which is lower than an upper surface of the signal lines.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
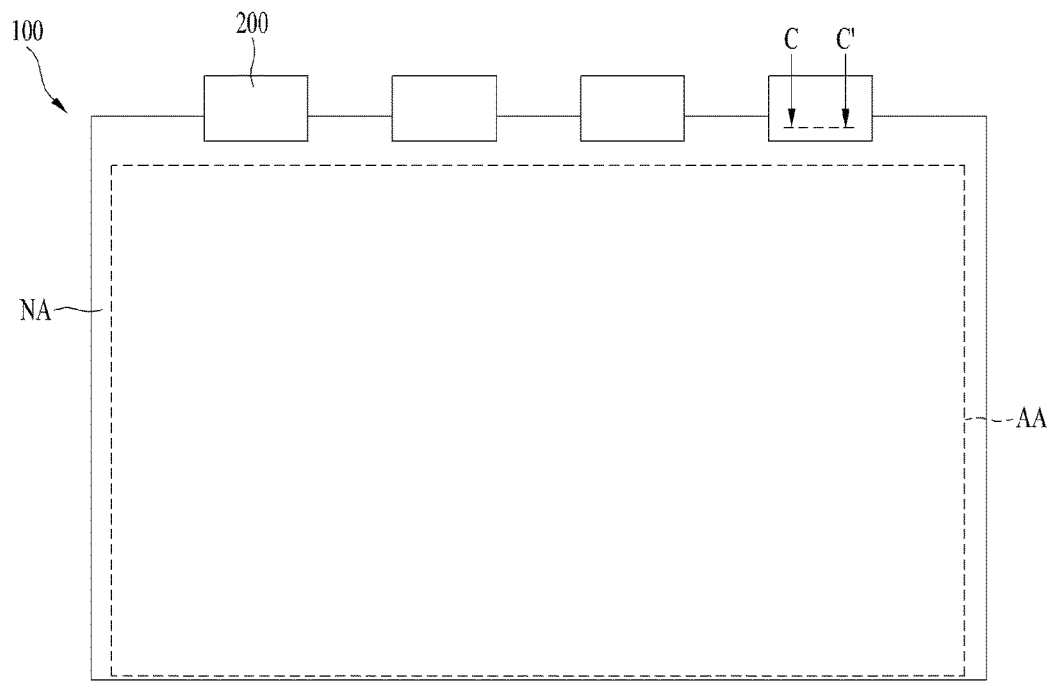
FIG. 1 is a view schematically illustrating a display device according to an embodiment of the present invention.

Hereinafter, details related to the above objects, technical configurations, and operational effects of the present invention will be clearly understood by the following detailed description with reference to the drawings, which illustrate embodiments of the present invention. Here, the embodiments of the present invention are provided in order to allow the technical sprit of the present invention to be sufficiently transferred to those skilled in the art, and thus the present invention may be embodied in other forms and is not limited to the embodiments described below.

In addition, the same or extremely similar elements are designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

FIG. 1 is a view schematically illustrating a display device according to an embodiment of the present invention. All components of the display device according to all embodiments of the present invention are operatively coupled and configured.

Referring to FIG. 1, the display device according to the embodiment of the present invention may include a display panel 100 that realizes images, and a circuit board 200 that applies signals related to the images to the display panel 100.

The display panel 100 may include a display area AA which realizes an image based on signals applied by the circuit board 200, and a non-display area NA which is located outside the display area AA. The circuit board 200 may be connected to the non-display area NA of the display panel 100.

Figure 2:
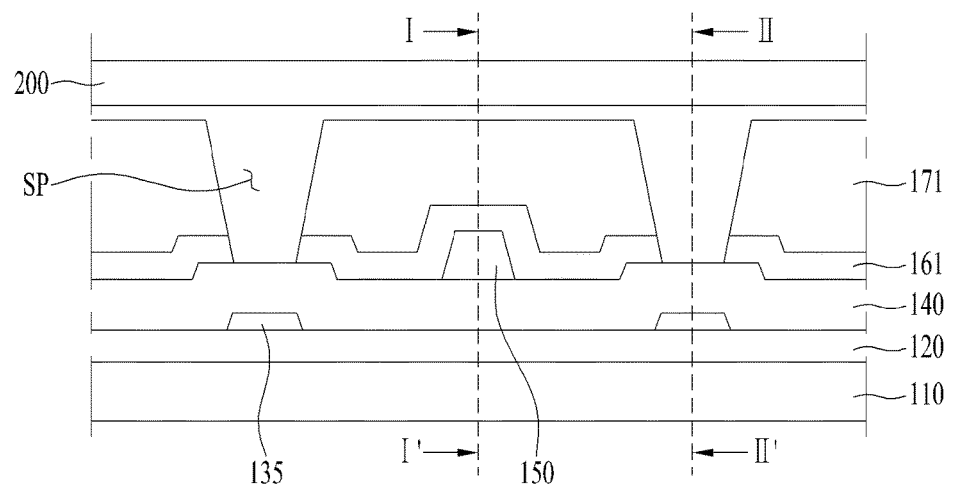
FIG. 2 is a cross-sectional view taken along line C-C' of FIG. 1.
Figure 3A:
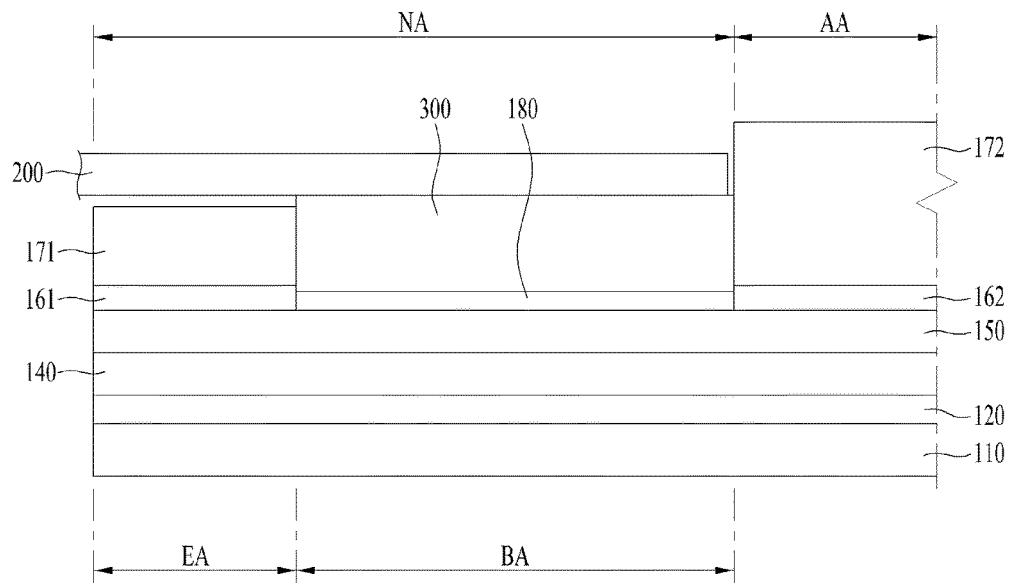
FIG. 3A is a cross-sectional view taken along line I-I' of FIG. 2.
Figure 3B:
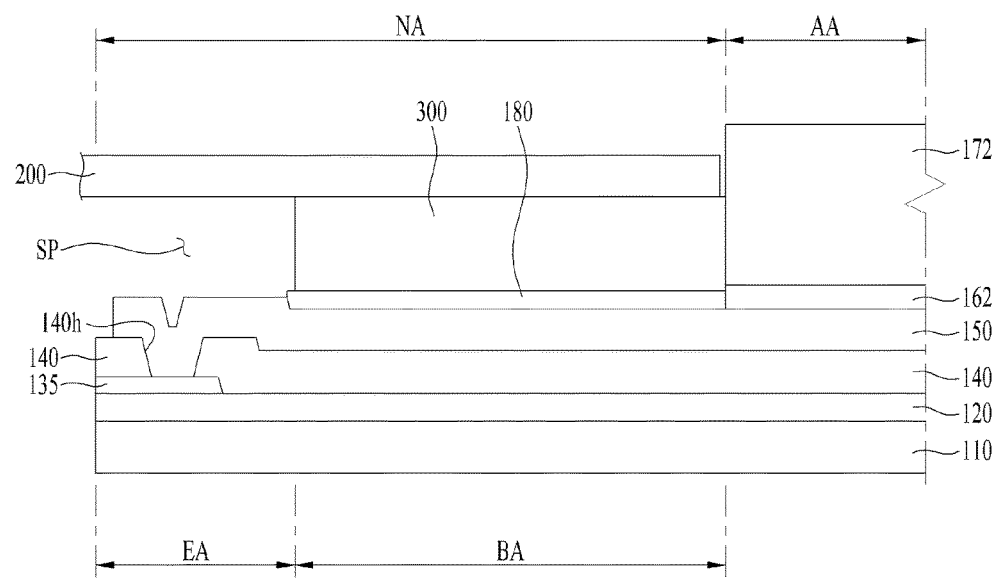
FIG. 3B is a cross-sectional view taken along line II-II' of FIG. 2.

FIG. 2 is a cross-sectional view taken along line C-C' of FIG. 1. FIG. 3A is a cross-sectional view taken along line I-I' of FIG. 2. FIG. 3B is a cross-sectional view taken along line II-II' of FIG. 2.

Referring to FIGS. 1, 2, 3A and 3B, the display panel 100 of the display device according to the embodiment of the present invention may include a lower substrate 110, a buffer layer 120 disposed on the lower substrate 110, an interlayer insulating layer 140 disposed on the buffer layer 120, signal lines 150 disposed on the interlayer insulating layer 140, an outer cover insulating layer 171 covering the signal lines 150 in the non-display area NA of the lower substrate 110, and an inner cover insulating layer 172 covering the signal lines 150 in the display area AA of the lower substrate 110.

The lower substrate 110 may include an insulating material. For example, the lower substrate 110 may include a glass or plastic substrate.

The lower substrate 110 may be a thin-film transistor (TFT) substrate. For example, gate lines, data lines intersecting the gate lines, thin-film transistors (TFTs) located at the intersections of the data lines and the gate lines, and pixel electrodes connected to the respective thin-film transistors may be disposed on the lower substrate 110.

Organic light-emitting layers disposed on the pixel electrodes and an upper common electrode covering the organic light-emitting layers may further be disposed on the lower substrate 110. For example, the display device according to the embodiment of the present invention may be an organic light-emitting display device. The display panel 100 may further include an encapsulation substrate coupled to the lower substrate 110.

The non-display area NA of the lower substrate 110 may include an edge area EA and a bonding area BA. The bonding area BA may be located between the display area AA and the edge area EA. In an example, the edge area EA may include the edge of the lower substrate 110.

Each of the buffer layer 120 and the interlayer insulating layer 140 may include an insulating material. The buffer layer 120 and the interlayer insulating layer 140 may insulate the elements formed in the display area AA of the lower substrate 110 from one another. For example, the buffer layer 120 may extend between the lower substrate 110 and the thin-film transistors. The interlayer insulating layer 140 may extend between a gate electrode and a source electrode of the thin-film transistor, and between a gate electrode and a drain electrode of the thin-film transistor. The interlayer insulating layer 140 may include the same material as the buffer layer 120. For example, the buffer layer 120 and/or the interlayer insulating layer 140 may include silicon oxide (SiO).

The display device according to the embodiment of the present invention is described such that the buffer layer 120 and the interlayer insulating layer 140 are stacked on the non-display area NA of the lower substrate 110. However, in a display device according to another embodiment of the present invention, the buffer layer 120 and/or the interlayer insulating layer 140 may not extend to the non-display area NA of the lower substrate 110. For example, in the display device according to another embodiment of the present invention, the interlayer insulating layer 140 may be in direct contact with the lower substrate 110 in the non-display area NA of the lower substrate 110.

The signal lines 150 may transmit signals realizing an image to the display area AA. For example, each of the signal lines 150 may be connected to gate line or data line. The signal lines 150 may extend from the display area AA to the bonding area BA and the edge area EA.

The signal lines 150 may include a conductive material. For example, the signal lines 150 may include a metal. The signal lines 150 may include the same material as the gate lines and/or the data lines.

The display device according to the embodiment of the present invention may further include shielding patterns 135, which are located between the buffer layer 120 and the interlayer insulating layer 140 in the edge area EA of the lower substrate 110. The shielding patterns 135 may include a conductive material.

The shielding patterns 135 may be electrically connected to a signal line 150, which applies a particular signal, among the signal lines 150. For example, each of the shielding patterns 135 may be electrically connected to a signal line 150 applying a supply voltage (e.g., a corresponding signal line 150 among the signal lines 150). Each shielding pattern 135 may vertically overlap the corresponding signal line 150. The interlayer insulating layer 140 may include contact holes 140h, which partially expose the shielding patterns 135. For instance, each shielding pattern 135 may be electrically or directly connected to the corresponding signal line 150 via the corresponding contact hole 140h. The contact holes 140h may be disposed on the edge area EA of the lower substrate 110.

The outer cover insulating layer 171 may be disposed on the edge area EA of the lower substrate 110. The outer cover insulating layer 171 may cover the signal lines 150. For example, the outer cover insulating layer 171 may extend along the edge of the lower substrate 110.

The outer cover insulating layer 171 may include an insulating material. In the edge area EA of the lower substrate 110, the adjacent signal lines 150 may be insulated from each other by the outer cover insulating layer 171.

The outer cover insulating layer 171 may include least one trench SP, which extends in the longitudinal direction of the signal lines 150. For the sake of brevity, one or more trenches SPs will be collectively referred to herein as the trench SP. The trench SP may penetrate the outer cover insulating layer 171 in the longitudinal direction of the signal lines 150. In an example, the trench SP may completely cross the edge area EA of the lower substrate 110.

The inner cover insulating layer 172 may be disposed on the display area AA of the lower substrate 110. The inner cover insulating layer 172 may cover the signal lines 150. The inner cover insulating layer 172 may include an insulating material. In the display area AA of the lower substrate 110, the adjacent signal lines 150 may be insulated from each other by the inner cover insulating layer 172. For example, the inner cover insulating layer 172 may include the same material as the outer cover insulating layer 171. The outer cover insulating layer 171 and the inner cover insulating layer 172 may be formed at the same time.

The circuit board 200 may apply signals related to an image to the display area AA of the lower substrate 110 through the signal lines 150.

The circuit board 200 may be electrically connected to the display panel 100 by the bonding area BA of the lower substrate 110. For example, the circuit board 200 may be electrically connected to the signal lines 150 by an anisotropic conductive film 300. The anisotropic conductive film 300 may be located on the signal lines 150 in the bonding area BA of the lower substrate 110. The anisotropic conductive film 300 may fill the space between the outer cover insulating layer 171 and the inner cover insulating layer 172.

In the display device according to the embodiment of the present invention, the outer cover insulating layer 171 covering the edge portions of the signal lines 150 that is disposed close to the edge of the lower substrate 110, may include at least one trench SP extending in the longitudinal direction of the signal lines 150. Thereby, in the display device according to the embodiment of the present invention, air bubbles generated by the anisotropic conductive film 300 in the process of connecting the circuit board 200 to the signal lines 150 disposed on the bonding area BA of the lower substrate 110, may be discharged to the outside of the bonding area BA of the lower substrate 110. Thus, the display device according to the embodiment of the present invention may prevent the signal lines 150 from being ripped, and may ensure the stable implementation of the process of connecting the circuit board 200.

In addition, the display device according to the embodiment of the present invention is described such that the trench SP formed in the outer cover insulating layer 171 penetrates the outer cover insulating layer 171 in the longitudinal direction of the signal lines 150. Thereby, in the display device according to the embodiment of the present invention, air bubbles that may be generated in the connecting process of the circuit board 200 can be completely discharged to the outside of the display panel 100. Thus, the display device according to the embodiment of the present invention can prevent the connecting process of the circuit board 200 from becoming unstable due to the presence of the air bubbles generated by the anisotropic conductive film 300.

In the display device according to the embodiment of the present invention, the trench SP may have a vertical depth that is sufficient for the air bubbles generated by the anisotropic conductive film 300 to move to the outside of the bonding area BA of the lower substrate 110. For example, in the display device according to the embodiment of the present invention, the trench SP may vertically penetrate the outer cover insulating layer 171. Thus, in the display device according to the embodiment of the present invention, the air bubbles generated by the anisotropic conductive film 300 may smoothly move toward the trench SP formed in the outer cover insulating layer 171.

The display device according to the embodiment of the present invention may further include an outer protective layer 161 and an inner protective layer 162 in order to prevent the entry of moisture from the outside. The outer protective layer 161 may be located between the signal lines 150 and the outer cover insulating layer 171 on the edge area EA of the lower substrate 110. The inner protective layer 162 may be located between the signal lines 150 and the inner cover insulating layer 172 on the display area AA of the lower substrate 110.

The outer protective layer 161 and the inner protective layer 162 may include an insulating material. The inner protective layer 162 may include the same material as the outer protective layer 161. For example, the outer protective layer 161 and the inner protective layer 162 may be formed at the same time. The outer protective layer 161 and the inner protective layer 162 may include a material different from that of the outer cover insulating layer 171 and the inner cover insulating layer 172. For example, the outer protective layer 161 and the inner protective layer 162 may include silicon nitride (SiN).

In the display device according to the embodiment of the present invention, the trench SP may penetrate (e.g., may be disposed within) the outer protective layer 161. For example, in the display device according to the embodiment of the present invention, some signal lines 150 may be exposed by the trench SP in the edge area EA of the lower substrate 110. In the display device according to the embodiment of the present invention, the lowermost level of a bottom surface of the trench SP may be lower than the upper surface of the signal lines 150. For example, in the display device according to the embodiment of the present invention, the bottom surface of the trench SP may be lower than the upper surface of the signal lines 150 at the outermost edge of the lower substrate 110. Thereby, in the display device according to the embodiment of the present invention, the air bubbles that may be generated by the anisotropic conductive film 300 can be smoothly and effectively discharged outward by the trench SP.

In the display device according to the embodiment of the present invention, in order to smoothly discharge the air bubbles generated in the connecting process of the circuit board 200, to the outside, the bottom surface of the trench SP may be lower than the lower surface of the anisotropic conductive film 300. For example, the display device according to the embodiment of the present invention may further include pad electrodes 180 covering the upper surface of the signal lines 150 on the bonding area BA of the lower substrate 110. The pad electrodes 180 may be located between the signal lines 150 and the anisotropic conductive film 300. The upper surface of the pad electrodes 180 may be higher than the bottom surface of the trench SP.

The pad electrodes 180 may include a conductive material. The circuit board 200 may be electrically connected to the signal lines 150 via the anisotropic conductive film 300 and the pad electrodes 180. For example, the pad electrodes 180 may include indium tin oxide (ITO).

Figure 4:
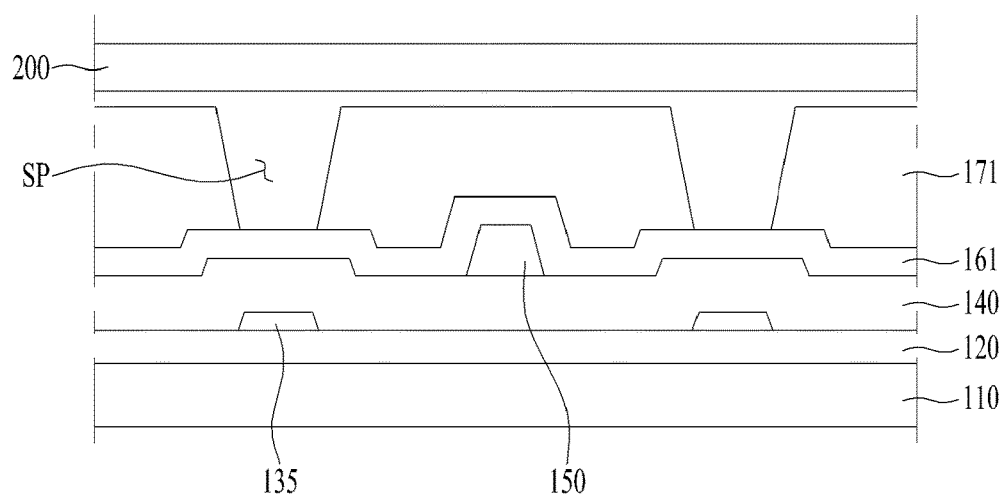
FIG. 4 is a cross-sectional view illustrating a display device according to another embodiment of the present invention.

The display device according to the embodiment of the present invention is described such that the trench SP vertically penetrates the outer cover insulating layer 171 and the outer protective layer 161. However, in the display device according to another embodiment of the present invention in which the air bubbles generated in the process of connecting the circuit board 200 smoothly move to the outside of the bonding area BA of the lower substrate 100 through the trench SP formed in the outer cover insulating layer 171, the trench SP may not vertically penetrate the outer protective layer 161. For example, in the display device according to another embodiment of the present invention, as illustrated in FIG. 4, the trench SP may expose the upper surface of the outer protective layer 161. That is, FIG. 4 is a cross-sectional view taken along line C-C' of FIG. 1 according to another example of the present invention. As shown in FIG. 4, the trench SP there is formed merely above the outer protective layer 161 and does not cut through the outer protective layer 161.

As is apparent from the above description, in a display device according to the embodiments of the present invention, an outer cover insulating layer, which is provided in an edge area to cover signal lines, may provide a space through which air bubbles generated in the process of connecting a circuit board may be discharged to the outside of a display panel. Thereby, the display device according to the embodiments of the present invention may prevent the signal lines from being ripped and may ensure the stable implementation of the process of connecting the circuit board. Accordingly, the display device according to the embodiments of the present invention may increase the reliability of the electrical connection between the display panel and the circuit board.

It will be apparent to those skilled in the art that the present invention described above is not limited to the embodiments described above and the accompanying drawings, and various substitutions, modifications, and alterations may be devised within the spirit and scope of the present invention.

What is claimed is:

1. A display device comprising:
a lower substrate including a display area, an edge area outside the display area, and a bonding area between the display area and the edge area;
signal lines on the display area of the lower substrate, the signal lines extending onto the bonding area and the edge area of the lower substrate;
an outer cover insulating layer on the edge area of the lower substrate, the outer cover insulating layer selectively covering the signal lines;
an anisotropic conductive film on the bonding area of the lower substrate; and
a circuit board on the anisotropic conductive film, the circuit board extending to the edge area of the lower substrate,
wherein the outer cover insulating layer includes at least one trench having a length extending in a longitudinal direction of the signal lines.

2. The display device according to claim 1, wherein the at least one trench completely crosses the edge area of the lower substrate in the longitudinal direction of the signal lines.

3. The display device according to claim 1, wherein the at least one trench vertically penetrates the outer cover insulating layer.

4. The display device according to claim 3, further comprising an outer protective layer between the signal lines and the outer cover insulating layer in the edge area of the lower substrate,
wherein the at least one trench vertically penetrates the outer protective layer.

5. The display device according to claim 1,
wherein a bottom surface of the at least one trench is lower than a lower surface of the anisotropic conductive film.

6. The display device according to claim 5, wherein a lowermost level of the bottom surface of the at least one trench is lower than an upper surface of the signal lines.

7. The display device according to claim 1, further comprising pad electrodes between the signal lines and the anisotropic conductive film in the bonding area of the lower substrate.

8. The display device according to claim 1, where the at least one trench includes a plurality of trenches that are connected with each other.

9. A display device comprising:
a lower substrate including a display area, an edge area outside the display area, and a bonding area between the display area and the edge area;
signal lines on the display area of the lower substrate, the signal lines extending onto the bonding area and the edge area of the lower substrate;
an outer cover insulating layer on the edge area of the lower substrate, the outer cover insulating layer selectively covering the signal lines;
an anisotropic conductive film on the bonding area of the lower substrate; and
a circuit board on the anisotropic conductive film, the circuit board extending to the edge area of the lower substrate,
wherein the outer cover insulating layer includes at least one trench extending in a longitudinal direction of the signal lines; and
wherein a bottom surface of the at least one trench is lower than a lower surface of the anisotropic conductive film.

10. A display device comprising:
a lower substrate including a display area, an edge area outside the display area, and a bonding area between the display area and the edge area;
signal lines on the display area of the lower substrate, the signal lines extending onto the bonding area and the edge area of the lower substrate;

an outer cover insulating layer on the edge area of the lower substrate, the outer cover insulating layer selectively covering the signal lines; and an anisotropic conductive film on the bonding area of the lower substrate, wherein the outer cover insulating layer includes at least one trench extending in a longitudinal direction of the signal lines; and wherein the at least one trench exposes a portion of the anisotropic conductive film.

\* \* \* \* \*